United States Patent
Chen et al.

(10) Patent No.: US 12,195,666 B2
(45) Date of Patent: Jan. 14, 2025

(54) THERMAL INTERFACE MATERIAL AND METHOD FOR MAKING THE SAME

(71) Applicant: Google LLC, Mountain View, CA (US)

(72) Inventors: Huijuan Chen, Fremont, CA (US);
Michael John Bliss, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 966 days.

(21) Appl. No.: 16/939,645

(22) Filed: Jul. 27, 2020

(65) Prior Publication Data
US 2022/0025241 A1    Jan. 27, 2022

(51) Int. Cl.
| C09K 5/14 | (2006.01) |
| C08K 3/04 | (2006.01) |
| C08K 3/08 | (2006.01) |
| C08K 3/22 | (2006.01) |
| H01L 23/373 | (2006.01) |

(52) U.S. Cl.
CPC ............ *C09K 5/14* (2013.01); *C08K 3/04* (2013.01); *C08K 3/08* (2013.01); *C08K 3/22* (2013.01); *H01L 23/3733* (2013.01); C08K 2003/0812 (2013.01); C08K 2003/2296 (2013.01); C08K 2201/001 (2013.01); C08K 2201/005 (2013.01)

(58) Field of Classification Search
CPC ... C09K 5/14; C08K 3/04; C08K 3/08; C08K 3/22; C08K 2003/0812; C08K 2003/2296; C08K 2201/001; H01L 23/3733
See application file for complete search history.

(56) References Cited

U.S. PATENT DOCUMENTS

| 6,869,642 | B2 | 3/2005 | Freuler | |
| 7,718,256 | B1 * | 5/2010 | Frank | C09J 163/00 428/354 |
| 8,080,499 | B2 * | 12/2011 | Lu | H01L 23/42 508/123 |
| 8,703,665 | B2 | 4/2014 | Branson et al. | |
| 8,900,704 | B1 | 12/2014 | Zinn | |
| 9,085,723 | B2 | 7/2015 | Myllynaki | |
| 9,598,558 | B2 * | 3/2017 | Myllymaki | C09C 1/44 |
| 9,598,623 | B2 * | 3/2017 | Myllymaki | C08K 3/22 |
| 9,613,882 | B2 | 4/2017 | Starkovich | |
| 10,287,471 | B2 | 5/2019 | Zhang | |
| 10,933,011 | B2 * | 3/2021 | Li | A61K 8/894 |
| 11,773,264 | B2 * | 10/2023 | Toya | C08K 3/04 524/496 |
| 12,043,786 | B2 * | 7/2024 | Stojanovic | C09K 5/14 |
| 2005/0049350 | A1 | 3/2005 | Tonapi et al. | |
| 2008/0291634 | A1 | 11/2008 | Weiser et al. | |
| 2009/0197099 | A1 * | 8/2009 | Su | C09K 5/14 428/447 |
| 2010/0022423 | A1 | 1/2010 | Lu et al. | |
| 2016/0076348 | A1 | 3/2016 | Fernandez-Ibanez et al. | |
| 2018/0163111 | A1 * | 6/2018 | Chang | C08K 3/28 |
| 2019/0194518 | A1 * | 6/2019 | Leolukman | C08K 3/38 |
| 2020/0017661 | A1 * | 1/2020 | Umemoto | B82Y 30/00 |
| 2021/0331928 | A1 * | 10/2021 | Shiro | C09D 7/62 |
| 2022/0025239 | A1 | 1/2022 | Chen et al. | |
| 2022/0259048 | A1 * | 8/2022 | Kimoto | C08K 5/101 |

FOREIGN PATENT DOCUMENTS

| CN | 1875480 | 12/2006 |
| CN | 1982404 | 6/2007 |
| CN | 101511981 | 8/2009 |
| CN | 101633833 | 1/2010 |
| CN | 101835830 | 9/2010 |
| CN | 104119841 | 10/2014 |
| CN | 104781325 | 7/2015 |
| CN | 105086950 | 11/2015 |
| CN | 103756321 | 5/2016 |
| CN | 106795596 | 5/2017 |
| CN | 107250317 | 10/2017 |
| CN | 108299779 | 7/2018 |
| CN | 109072051 | 12/2018 |
| CN | 110446682 | 11/2019 |
| CN | 113185953 | 7/2021 |
| EP | 2900747 | 8/2015 |
| EP | 3036764 | 6/2016 |
| JP | 2004-090516 | 3/2004 |
| TW | 201005080 | 2/2010 |

(Continued)

OTHER PUBLICATIONS

Extended European Search Report in European Application No. 21166928.8, dated Oct. 12, 2021, 8 pages.
Extended European Search Report in European Application No. 21166909.8 dated Oct. 12, 2021, 9 pages.
Chou et al., "Thermal Conductivity of Diamond-Containing Grease," Journal of Electronic Packaging, Dec. 2010, 132(4):1-7.
Nan et al., "Bioinspired modification strategy to improve thermal conductivity of flexible poly(vinyl alcohol)/nanodiamond nanocomposite films for thermal management applications," Applied Surface Science, Apr. 1, 2020, 14 pages.

(Continued)

*Primary Examiner* — Jane L Stanley
(74) *Attorney, Agent, or Firm* — Fish & Richardson P.C.

(57) ABSTRACT

A method of making a thermal interface material includes: combining a powder of diamond particles having a nominal dimension of 1,000 nm or less with a volatile liquid hydrocarbon material to provide a diamond dispersion; and combining the diamond dispersion with a first mixture to provide the thermal interface material, wherein the first mixture includes a matrix material and particles of a first material have a nominal dimension in a range from 1 micron to 100 microns, and wherein the diamond particles compose 0.5 wt. % to 5 wt. % of the thermal interface material, the matrix material composes 10 wt. % or less of the thermal interface material, and the first material composes at least 40 wt. % of the thermal interface material.

19 Claims, 7 Drawing Sheets

(56) References Cited

FOREIGN PATENT DOCUMENTS

| TW | 201245338 | 11/2012 | |
|---|---|---|---|
| TW | 201607129 | 2/2016 | |
| TW | 201632606 | 9/2016 | |
| WO | WO 2002/085339 | 10/2002 | |
| WO | WO 2016/089410 | 6/2016 | |
| WO | WO 2016086410 | 6/2016 | |
| WO | WO 2017006460 | 1/2017 | |
| WO | WO 2018186382 A1 * | 10/2018 | ............. C01B 32/28 |

OTHER PUBLICATIONS

Taha-Tijerina et al., "Nanodiamond-based thermal fluids," ACS Appl. Mater. Interfaces, Mar. 21, 2014, 6:4778-4785.

Office Action in Chinese Application No. 202110377231.4, dated Mar. 23, 2022, 18 pages (with English translation).

material-properties.org [online], "Density of Chemical Elements," Aug. 8, 2019, retrieved on Jun. 14, 2022, retrieved from URL<view-source:https://material-properties.org/density-of-chemical-elements/>, 7 pages.

material-properties.org [online], "Diamond—Density—Melting Point—Thermal Conductivity," May 10, 2021, retrieved on Jun. 14, 2022, retrieved from URL<https://material-properties.org/diamond-density-melting-point-thermal-conductivity/>, 8 pages.

CN Office Action in Chinese Appln. No. 202110398523.6, dated Aug. 18, 2022, 10 pages (with English Translation).

Office Action in Chinese Appln. No. 202110377231.4, mailed on Mar. 23, 2022, 18 pages (with English translation).

Yulin, "Lubrication and Self-Repair Techniques of Nanoparticles" Sep. 30, 2005, 13 pages (with English abstract).

Office Action in Taiwan Appln. No. 110111614, mailed on Apr. 23, 2024, 8 pages.

Office Action in Taiwan Appln. No. 110111643, mailed on Jun. 28, 2024, 14 pages (with English translation).

* cited by examiner

THERMAL INTERFACE MATERIAL AND METHOD FOR MAKING THE SAME

FIELD OF THE DISCLOSURE

The disclosure relates to thermal interface materials and methods of making thermal interface materials.

BACKGROUND

Thermal interface Materials (TIMs) are a category of compounds used to aid thermal conduction between mechanically-mated surfaces, such as a semiconductor device and a heat sink. In general, a TIM is any material that is inserted between two components in order to enhance the thermal coupling between them.

An example of a TIM is a thermal grease, which is a class of compounds commonly used in the electronics industry. Typically, a thermal grease is used to provide a thin, uncured layer between two components where the viscosity of the grease allows it to stay in position during use. The thermal grease ideally fills the gaps or spaces in the interface in order to increase heat transfer and/or heat dissipation.

Another example of a TIM is a thermal adhesive. Often, a thermal adhesive is cured and provides some mechanical strength to a bond between the two components after curing. Other examples of TIMs include thermal gap fillers, thermally conductive pads, and thermal tapes.

SUMMARY

A hybrid thermal interface material (TIM) containing diamond particles and other solid filler can achieve high thermal conductivity, e.g., 6 W/(m K) or more. The solid particles are designed with an engineered particle size distribution to provide a high pack density while the diamond particles are small enough to avoid significant scratching on a mating surface. Further, the diamond loading can be less than 10 wt. %, which can make the thermal interface material more cost effective.

In general, in a first aspect, the invention features a thermal interface material for forming a layer conformable between a first heat transfer surface and an opposing second heat transfer surface to provide a thermal pathway therebetween, the compound including: a matrix material composing 10 wt. % or less of the thermal interface material; a filler dispersed in the matrix material composing at least 80 wt. % of the thermal interface material, the filler including: particles of a first material having a nominal dimension in a range from 1 micron to 100 microns, the first material composing at least 40 wt. % of the thermal interface material; and diamond particles having a nominal dimension of 1,000 nm or less, the diamond particles composing 0.5 wt. % to 5 wt. % of the thermal interface material.

Embodiments of the thermal interface material can include one or more of the following features and/or features of other aspects. For example, the thermal interface material can have a thermal conductivity of 6 W/(m K) or more, e.g., in a range from 6 W/(m K) to 10 W/(m K).

The thermal interface material can include a volatile hydrocarbon material, the volatile hydrocarbon material composing 10 wt. % or less of the thermal interface material. The volatile hydrocarbon material can be isoparaffin.

The first material can be a metal, a metal oxide, a metal nitride, or a carbide. The first material can be selected from the group consisting of aluminum, silver, gold, aluminum nitride, silicon carbide, aluminum oxide, zinc oxide, and cubic boron nitride. The filler can include particles of a second material different from the first material. The second material can be a metal, a metal oxide, a metal nitride, or a carbide. The second material can be selected from the group consisting of aluminum, silver, gold, aluminum nitride, silicon carbide, aluminum oxide, zinc oxide, and cubic boron nitride. The particles of the second material can have a nominal dimension in a range from 0.1 micron to 20 microns. A nominal size of the particles of the second material can be less than the nominal size of the particles of the first material. The nominal size of the particles of the second material is greater than the nominal size of the diamond particles (e.g., 20% or more greater, 50% or more greater, 100% or more greater, 200% or more greater).

The particles of the metal oxide can have a nominal dimension larger than the diamond particles and smaller than the particles of the first material.

The diamond particles can have a nominal dimension of 500 nm or less. For example, the diamond particles can have a nominal dimension in a range from 10 nm to 500 nm.

In general, in another aspect, the invention features a system, including: an integrated circuit device; a heat sink; and a layer of the thermal interface material forming an interface between a surface of the integrated circuit device and a surface of the heat sink.

Embodiments of the system can include one or more of the following features and/or features of other aspects. For example, the interface can have a thickness corresponding to the nominal dimension of the particles of the first material. The integrated circuit device can be a data processing unit.

In general, in a further aspect, the invention features a method, including: providing a layer of a thermal interface material between a first component of a device and a second component of the device, the first component including an integrated circuit and the thermal interface material including diamond nanoparticles and having a thermal conductivity of 6 W/(m K) or more; and transferring heat from the first component to the second component via the layer of thermal interface material.

In general, in another aspect, the invention features a method of making a thermal interface material, including: combining a powder of diamond particles having a nominal dimension of 1,000 nm or less with a volatile liquid hydrocarbon material to provide a diamond dispersion; and combining the diamond dispersion with a first mixture to provide the thermal interface material, wherein the first mixture includes a matrix material and particles of a first material have a nominal dimension in a range from 1 micron to 100 microns, and wherein the diamond particles compose 0.5 wt. % to 5 wt. % of the thermal interface material, the matrix material composes 10 wt. % or less of the thermal interface material, and the first material composes at least 40 wt. % of the thermal interface material.

Implementations of the method can include one or more of the following features and/or features of other aspects. For example, prior to combining the powder of diamond particles with the hydrocarbon material, the powder can be filtered to reduce an amount of diamond particles larger than the nominal dimension in the powder. The powder can be filtered by sieving.

Prior to combining the powder of diamond particles with the hydrocarbon material, the powder can be washed using an organic solvent. After the powder is washed and prior to combining the powder of diamond particles with the hydrocarbon material, the powder can be reatomized.

Combining the powder of diamond particles with the hydrocarbon material can include agitating and/or sonicating the powder together with the hydrocarbon material.

The hydrocarbon material can be isoparaffin.

Combining the diamond dispersion with a first mixture includes agitating and/or sonicating the diamond dispersion together with the first mixture.

The method can include de-aerating the thermal interface material. De-aerating the thermal interface material can include milling the thermal interface material. In some embodiments, de-aerating the thermal interface material includes exposing the thermal interface material to a vacuum degassing mixer.

The first mixture can be deaerated prior to combining with the diamond dispersion.

The thermal interface material consists essentially of the matrix material and a filler, the filler comprising the diamond powder and particles of the first material, wherein the filler comprises 80 wt. % or more of the thermal interface material.

The diamond particles can have a nominal dimension in a range from 10 nm to 500 nm.

The first material can be a metal, a metal oxide, a metal nitride, or a carbide.

The first material can be selected from the group consisting of aluminum, silver, gold, aluminum nitride, silicon carbide, aluminum oxide, zinc oxide, and cubic boron nitride.

The first mixture can include particles of a second material different from the first material. The second material can be a metal, a metal oxide, a metal nitride, or a carbide. The second material can be selected from the group consisting of aluminum, silver, gold, aluminum nitride, silicon carbide, aluminum oxide, zinc oxide, and cubic boron nitride.

Among other advantages, embodiments of the thermal interface material can provide high thermal conductivity without significantly scratching surfaces in contact with the TIM during use. For example, providing a TIM with metal-metal oxide-diamond content and size distribution in appropriate ranges, it is possible to provide a TIM with a thermal conductivity of 6 W/(m K) or more (e.g., up to 10 W/(m K)).

The TIMs disclosed herein can enable improved performance of high-powered computing devices. For example, in applications where the TIM is the largest bottleneck in heat extraction, the TIMs disclosed herein can help manage heat produced by such devices more efficiently than conventional TIMs.

Other advantages will be apparent from the description, the drawings, and the claims.

DETAILED DESCRIPTION

Figure 1:
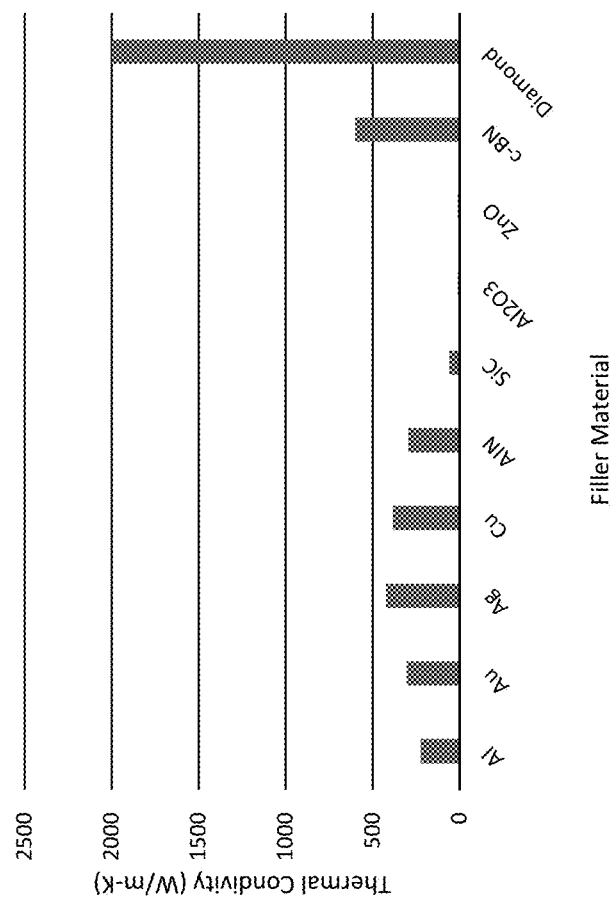
FIG. 1 is a plot comparing experimental values of thermal conductivity of different materials.

In general, thermal interface materials (TIMs) of the present disclosure are composed of a matrix material and a filler that includes at least two types of particles dispersed in the matrix material, including diamond particles.

It is believed that including small (e.g., nano-sized) diamond powder along with a larger-sized filler material can improve the solid particle loading of the TIM and provide superior thermal conductivity as a filler material. Therefore, it is possible that a TIM with small diamond particles achieve higher thermal performance than TIMs that do not include diamond particles.

The hardness of diamond is higher than the other filler materials in the TIM and harder than the surfaces the TIM contacts upon application. This means when a TIM with diamond powder is applied on a surface, it is possible that the diamond particles with sharp edges act as a cutting tool and damage the surface. To avoid this, a combination of different types of filler materials is used with a carefully engineered particle size distribution. Diamond particles are designed to be much smaller than the other filler materials, so when the TIM is compressed between two surfaces there will be little or no compression force applied on the diamond particles. The other filler particles, which can be in the form of balls or natural crystals, act as a supporting material, maintaining a spacing between the surfaces when compression force is applied. This can avoid pressing the diamond particles against a surface which can result in damage to the surface due to the hard diamond particles.

The matrix material generally composes 10 wt. % or less (e.g., 9 wt. % or less, 8 wt. % or less, 7 wt. % or less, 6 wt. % or less, such as 5 wt. %) of the TIM. Generally, there is sufficient matrix material to provide a continuous phase binder for the dispersed materials while not significantly adversely impacting the thermal performance of the TIM. The matrix material can be a polymer material, such as a silicone, a siloxane (e.g., polydimethylsiloxane), an olefin polymer, an acryl polymer, ABS, epoxies, Acryl a siloxane polymer (e.g., polydimethylsiloxane).

The dispersed materials provide a thermally conductive filler for the TIM and can compose the balance of the TIM, e.g., 80 to 90 wt. % or more of the TIM.

The diamond particles dispersed in the matrix material are generally very small, having a nominal dimension of 500 nm or less. For example, the diamond particles can have a nominal dimension of 250 nm or less (e.g., 200 nm or less, 150 nm or less, 100 nm or less, 75 nm or less, 60 nm or less, 50 nm or less, 40 nm or less). As used herein, the nominal dimension refers to the specified dimension of the particles in a diamond powder. Generally, a powder will include a distribution of particle sizes. Depending on the powder, at least a certain percentage of the particles will have a maximum dimension of the nominal dimension or less. For example, a diamond powder with a nominal dimension of 50 nm can have at least 90% of the particles having a maximum dimension of 50 nm or less. As another example, a diamond powder of nominal dimension 20 nm can have at least 80% of the particles having a maximum dimension of 20 nm or less. Generally, at least 50% (e.g., 60% or more, 70% or more, 80% or more, 90%) of a powder will be composed of particles having a maximum dimension of the nominal dimension or less.

Generally, the amount of diamond powder is selected to provide good thermal conductivity while still being dispersed in the matrix material. At too high concentrations, the diamond particles can clump together, separating from the matrix material and resulting in the TIM falling apart or dry out. The diamond particles can compose 0.5 wt. % to 10 wt. % of the TIM. For example, the diamond particles can compose 0.6 wt. % or more (e.g., 0.75 wt. % or more, 0.9 wt. % or more, 1 wt. % or more, 1.25 wt. % or more, 1.5 wt. % or more, 1.75 wt. % or more, 2 wt. % or more, 2.5 wt. % or more, 3 wt. % or more, 4 wt. % or more, 5 wt. % or more, 6 wt. % or more, such as 9 wt. % or less, 8 wt. % or less, 7 wt. % or less) of the TIM.

The dispersed particles (filler) also include at least a first type of non-diamond particle having a nominal dimension that is significantly larger than the nominal dimension of the diamond particles. For example, the first type of particle can have a nominal dimension in a range from 1 microns to 100 microns (e.g., 5 microns or more, 10 microns or more, 20 microns or more, such as up to 80 microns or less, 50 microns or less).

The first type of non-diamond particle type typically composes the bulk of the dispersed particles in the TIM. In some embodiments, this non-diamond particle can compose 40 wt. % or more of the TIM. For example, the first type of non-diamond particle can compose 50 wt. % or more (e.g., 55 wt. % or more, 60 wt. % or more, 65 wt. % or more) of the TIM.

In some embodiments, the first type of non-diamond particle can be a metal powder, such as aluminum powder. Generally, the first type of non-diamond particle is selected to provide good thermal conductivity and structural integrity for the TIM. The first non-diamond particle can be a softer material than diamond to reduce scratching surfaces on which the TIM is placed.

In some embodiments, the dispersed particles include a second non-diamond material, such as particles of a metal oxide. Metal oxide particles can be larger than the diamond nanoparticles and smaller than the first type of non-diamond particle. For example, the metal oxide particles can have a nominal dimension in a range from 0.1 micron to 20 microns (e.g., 0.5 microns or larger, 1 micron or larger, 5 microns or larger). The metal oxide can compose 5 wt. % to 25 wt. % of the TIM. For example, the metal oxide can compose 10 wt. % or more of the TIM (e.g., 15 wt. % to 20 wt. %). Certain metal oxides can increase the viscosity of the TIM and make it more compact. In some embodiments, the metal oxide is Zinc Oxide. Other examples include alumina, aluminum oxide.

Other powders can be included in addition or as an alternative to the metal oxide, e.g., metal hydroxide powder, a nitride, or a carbide, etc.

In general, the filler can include more than two different types of non-diamond particles. These can include metals (e.g., aluminum, gold, silver, copper), metal oxides (e.g., zinc oxide, aluminum oxide), nitrides (e.g., aluminum nitride, cubic boron nitride), and/or carbides (e.g., silicon carbide).

FIG. 1 shows a plot comparing the thermal conductivity of different materials that can be used in the TIM as filler materials. The vertical axis shows thermal conductivity in units of Watts per meter per Kelvin (W/m K). As is evident, diamond has a significantly higher thermal conductivity than the other materials plotted in FIG. 1.

In some embodiments, the TIM can include additional components, such as a dispersant to facilitate mixing and/or application of the TIM, but which can be flashed off on application to a surface. The dispersant can be selected to increase or decrease the viscosity of the TIM, as desired. Typically, the dispersant is a volatile hydrocarbon that is liquid at room temperature, such as isoparaffin. Typically, loading of the dispersant is less than 10% by weight (e.g., 8 wt. % or less, 6 wt. % or less, 5 wt. % or less, 4 wt. % or less, 3 wt. % or less).

Other additives can be included. For example, the TIM can include special additives including a material to improve heat-resistance, a flame retardant, pH stabilizer, etc.

After flashing off the dispersant, the TIM can have a thermal conductivity of 6 W/(m K) or more (e.g., 6.1 W/(m K) or more, 6.2 W/(m K) or more, 6.3 W/(m K) or more, 6.4 W/(m K) or more, 6.5 W/(m K) or more, 6.6 W/(m K) or more, 6.7 W/(m K) or more, 6.8 W/(m K) or more, 6.9 W/(m K) or more, 7 W/(m K) or more, 7.5 W/(m K) or more, 8 W/(m K) or more, 8.5 W/(m K) or more, 9 W/(m K) or more, 9.5 W/(m K) or more, such as up to 10 W/(m K)).

Figure 2:
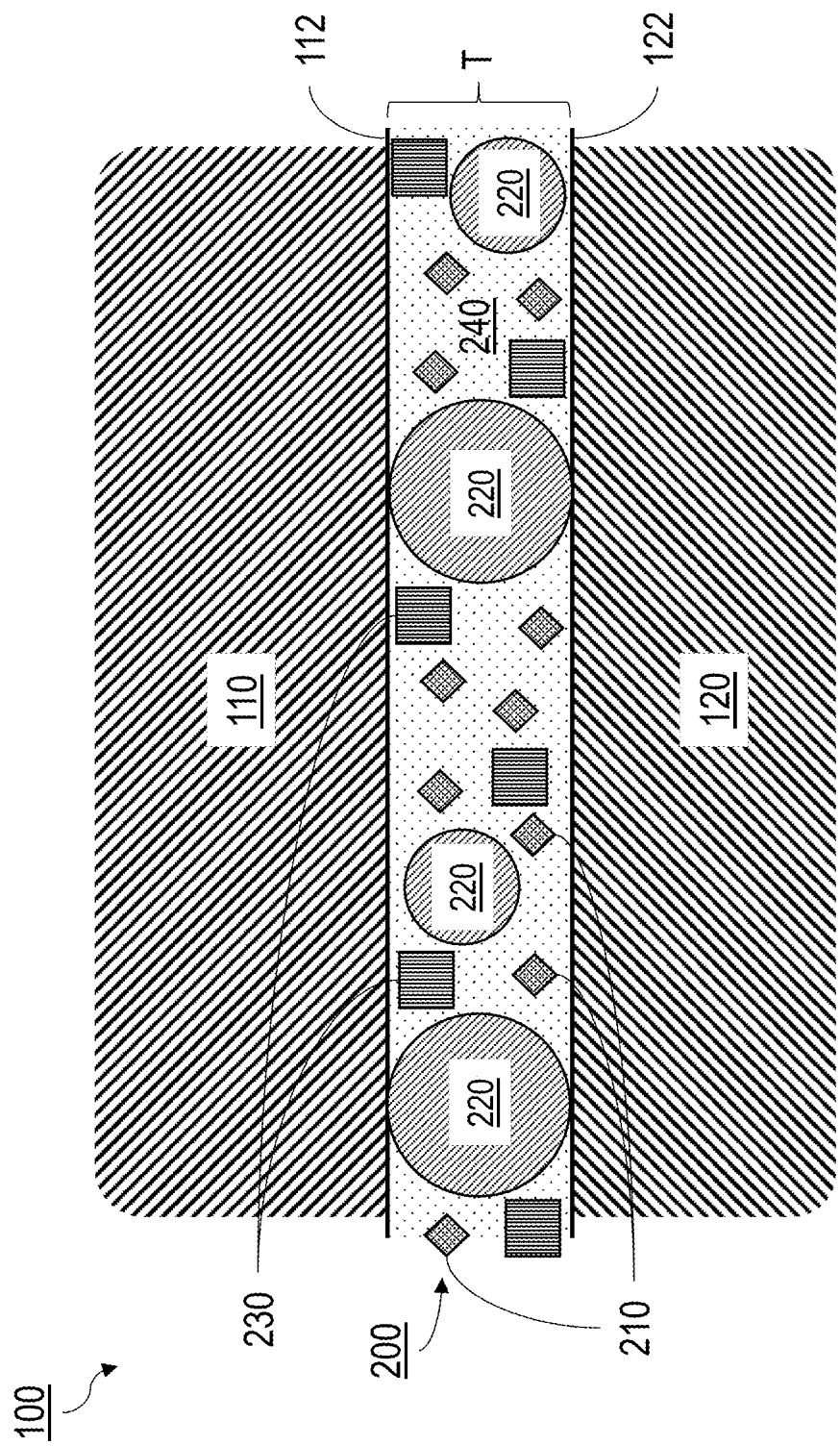
FIG. 2 is a cross-sectional schematic diagram showing a thermal grease at an interface between two components.

FIG. 2 illustrates a TIM used at an interface 100 between two components and forms a layer that is conformable between the surfaces forming the interface to provide a thermal pathway there between. As depicted, a layer 200 of a TIM grease fills a space between a surface 112 of a first component 110 and a surface 122 of a second component 120. The TIM grease is composed of a matrix material 240 forming a continuous phase in the space between the surfaces. The dispersed phase is composed of large particles 220 (e.g., Aluminum particles), small diamond particles 210, and metal oxide particles 230 (e.g., zinc oxide).

In many applications, layer 100 is relatively thin, having a thickness T of 100 microns or less (e.g., 75 microns or less, 50 microns or less). The layer thickness typically depends on the quality of the finish of surfaces 112 and 122, and flatter surfaces can provide a thinner interface under the same pressure loading. The thickness of the layer can also be established by the dimension of particles 220, which can act as spacers between the two surfaces.

Figure 3A:
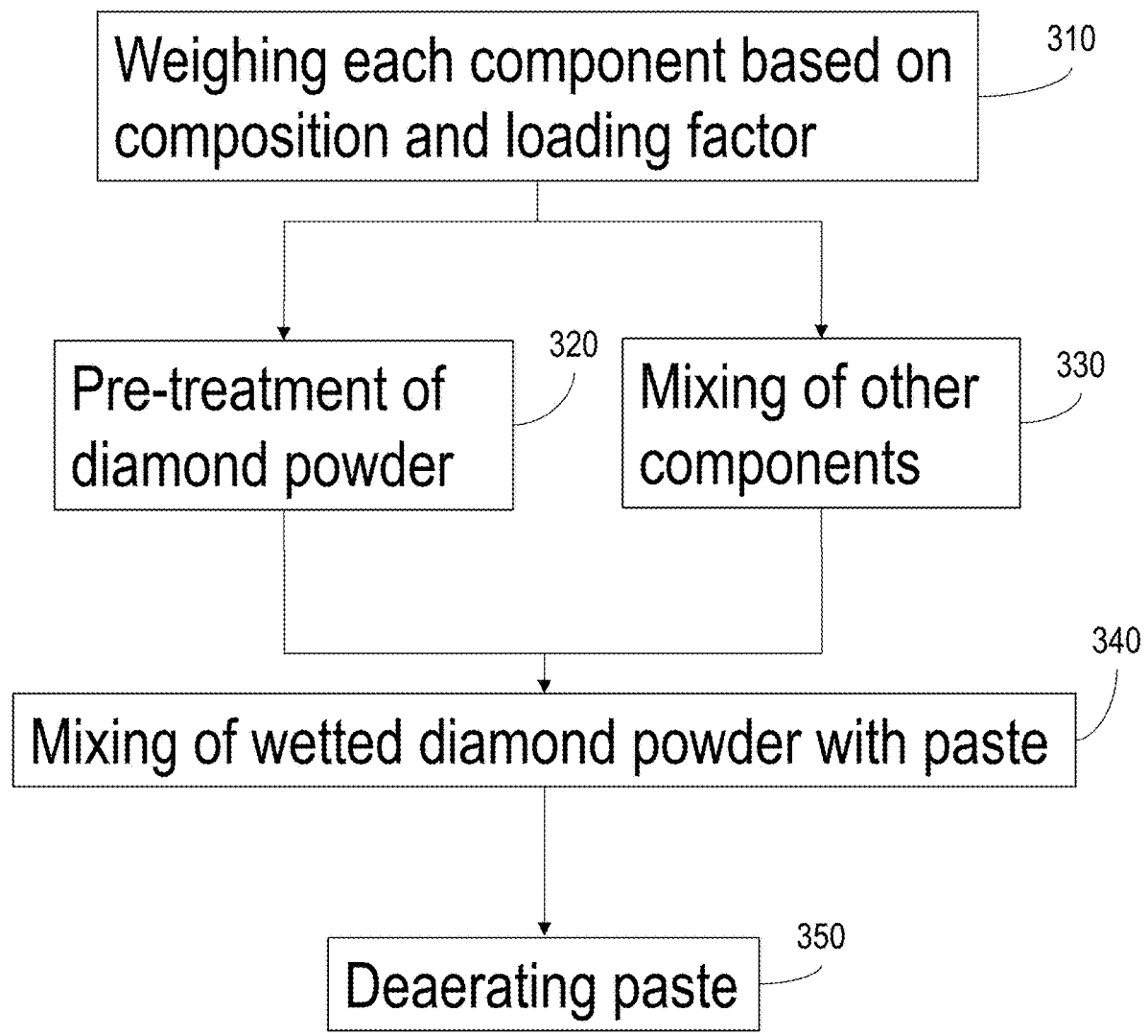
FIGS. 3A and 3B are flow charts showing example methods of preparing a thermal interface material.

Generally, a variety of different suitable techniques can be used to mix the various components. Steps in an example process 300 is shown in a flowchart in FIG. 3A. In a first step 310, each component of the TIM is weighed out according to the composition and loading factor.

After being weighed out to the appropriate amounts, the diamond powder is pre-treated (step 320) as follows. First, the diamond powder is cleaned to provide a powder of appropriate purity and homogeneity in which the particles have clean surfaces before being mixed with other components.

In general, the filtration process depends on what type and size of impurity that the diamond powder includes. Filtration can be performed by centrifuging or using a sieve (e.g., a vibrating sieve). Filtration can be particularly useful in reducing the proportion of the powder composed of particles larger than the nominal dimension. Alternatively, or additionally, filtration can be useful to remove impurities from the diamond powder, such as for example, to remove non-diamond particles from the powder.

Suitable cleaning techniques can also include washing with solvent. For instance, in some embodiments, the diamond powder can be washed with an organic solvent, such as ethanol, then with pure water. Washing can remove organic impurities, such as oils, from the diamond particles. Washing can be performed using sonication and/or agitation.

After washing, the diamond powder is dried and re-powdered. When drying diamond powder from water by evaporating, for example, the fine dry diamond powder is in agglomerated form like concrete. Ideally, the diamond powder should be close to or 100% dispersed before use. One can use an ultrasonic probe to disperse and re-powder the diamond particles. Alternatively, or additionally, the diamond particles can be spread in a thin layer and dried to avoid or reduce agglomeration. During the drying and dispersion process, the dispersion system should be properly cooled to remove any heat generated.

Next, the dried diamond powder is pre-wet in preparation for mixing. For example, the diamond powder can be pre-wet by mixing with a dispersant like isoparaffin. Generally, the amount of dispersant can be selected to provide a pre-wet mixture with a suitable viscosity for combining with the other components. In some embodiments, the amount of the dispersant can be 1 wt. % or more (e.g., 2 wt. % or more, 3 wt. % or more, 4 wt. % or more, 5 wt. % or more, 6 wt. % or more, such as up to 8 wt. %) of the TIM. Pre-wetting can include sonication and/or agitation to ensure a homogenous mixture.

In a further step (330), the other components are mixed together. This can be performed concurrently, in parallel, with step 320. In some embodiments, mixing is performed placing the other pre-weighed components in a stirring tank and mixing them together to form a homogeneous dispersion. Generally, the stirring velocity can be selected to efficiently homogenize the mixture. For example, stirring velocities can be in a range from 500 rpm to 5000 rpm. The velocity can be varied during the mixing process. For example, the process can start at relatively low velocities which are increased as the process proceeds.

In some implementations, additional grinding can be performed on the mixture to improve dispersion and/or fluidity. For instance, a high speed colloidal mill can be used to grind the mixture. After mixing and grinding, the mixture is a paste with fluidity.

In step 340, the wetted diamond powder is combined with the other premixed components to provide a paste. This step can be performed using a sonicator in order to adequately combine and disperse the diamond powder with the other components.

Finally, in step 350, the resulting paste is deaerated. This can involve using a mill (e.g., a three-roll mill) to deaerate the paste. Milling can also improve the pack density. Further deaeration can be performed using a vacuum degassing mixer to obtain the final product.

Figure 3B:
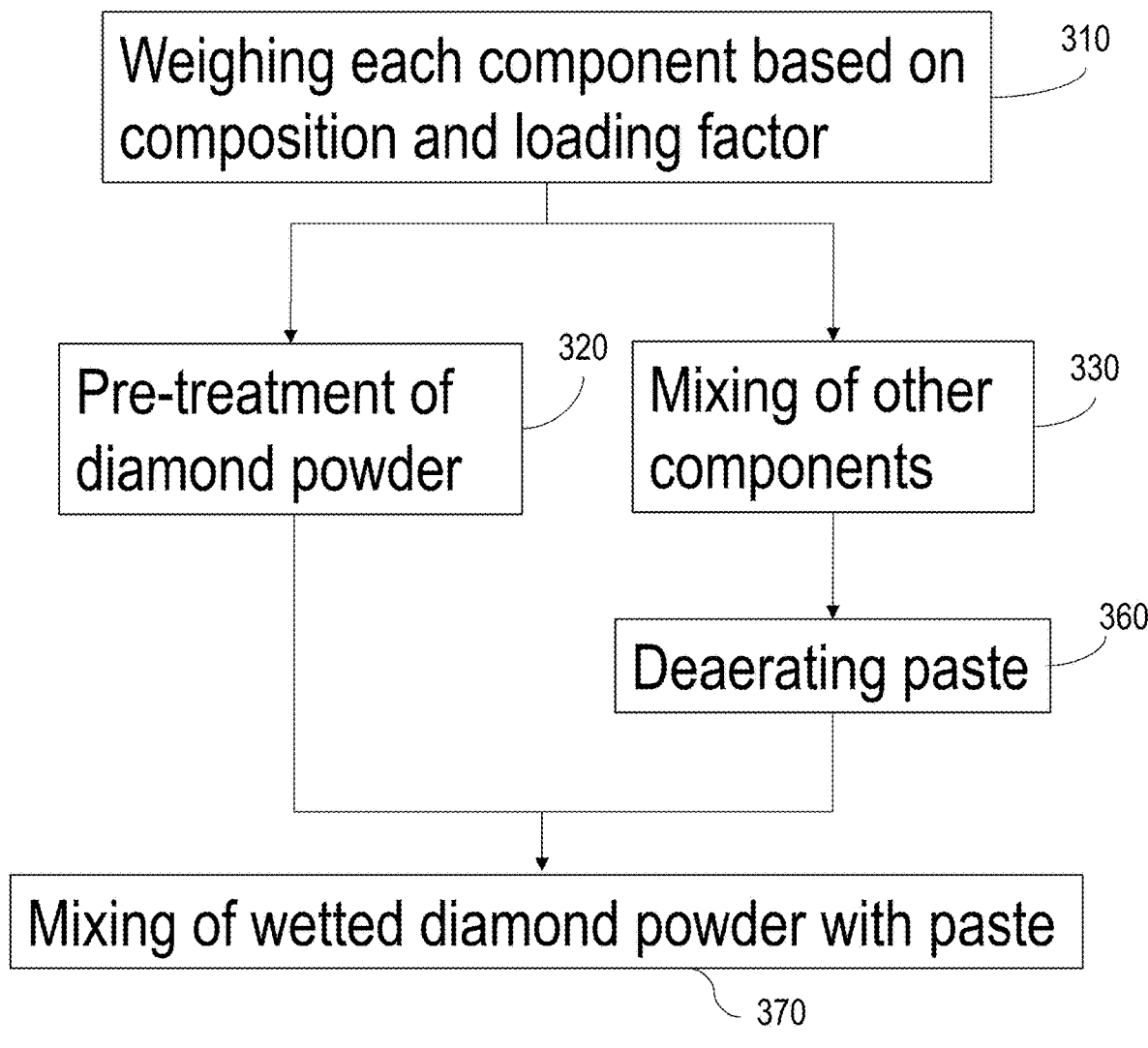

Variations on process 300 are possible. For example, referring to FIG. 3B, another example process 301 includes steps 310, 320, and 330 as described above. However, prior to combining the wetted diamond powder and the paste, the paste is deaerated in step 360. The deaerated paste is then mixed with the wetted diamond powder in step 370. Deaerating the mixed components prior to mixing with wetted diamond powder can reduce (e.g., eliminate) the need to degas the composition after mixing. For instance, when the wetted diamond powder is sonicated into the deaerated paste, introduction of additional air bubbles can be reduced (e.g., avoided) and the sonication can facilitate degassing.

In some implementations, additional steps can be included. For instance, additional dispersant can be added to the final product to optimize the consistency of the TIM. Additional isoparaffin, for example, can be added to the degassed mixture.

Figure 4:
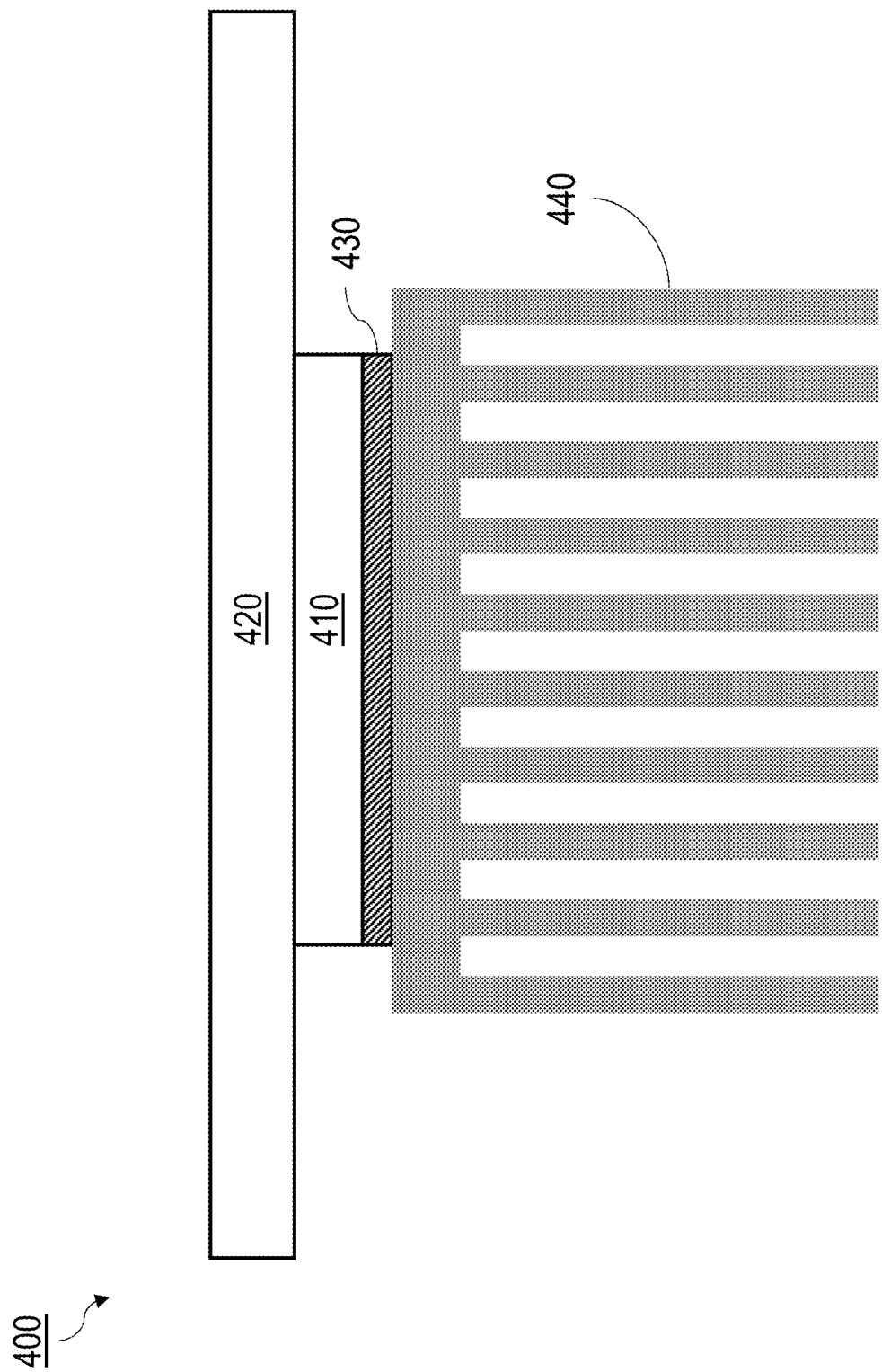
FIG. 4 is a cross sectional view showing an example processor module that includes a thermal interface material between a processor unit and a heat sink.

In general, the disclosed TIMs can be used in a variety of applications. In some implementations, TIM is used for thermal grease in integrated circuit devices, such as processors (e.g., central processing units, graphics processing units, etc.). For example, the two components shown in FIG. 2 can correspond to an integrated circuit device and a heat sink. Such an arrangement is illustrated in FIG. 4, which shows a processor module 400 that includes a processor unit 410 mounted on a printed circuit board (PCB) 420. On the opposite side from the PCB, a heat sink 440 is secured to processor unit 410. A layer 430 of a TIM grease as described above is provided at the interface between processor unit 410 and heat sink 440, facilitating transport of heat from the processor to the heat sink.

EXAMPLES

The following example formulations were prepared using the method described above.

Example 1

Polymer Matrix: Polydimethylsiloxane (100 parts total; 9.7 wt. %)
Thermally conductive filler: Aluminum powder (650 parts; 63.4 wt. %), Zinc oxide powder (200 parts; 19.5 wt. %), Diamond powder (50 nm nominal dimension, 1 part; 0.1 wt. %)
Additives: Isoparaffin (75 parts; 7.3 wt.

Example 2

Polymer Matrix: Polydimethylsiloxane (100 parts total; 9.7 wt. %)
Thermally conductive tiller: Aluminum powder (650 parts; 63.3 wt. %), Zinc oxide powder (200 parts; 19.5 wt. %), Diamond powder (50 nm, 2.5 parts; 0.2 wt.) %)
Additives: Isoparaffin (75 parts; 7.3 wt. %)

Example 3

Polymer Matrix: Polydimethylsiloxane (100 parts total; 9.7 wt. %)
Thermally conductive filler: Aluminum powder (650 parts; 62.8 wt. %), Zinc oxide powder (200 parts; 19.3 wt. %), Diamond powder (50 nm, 10 parts; 1.0 wt. %)
Additives: Isoparaffin (75 parts; 7.2 wt.

Comparative Example 1

Polymer Matrix: Polydimethylsiloxane (100 parts total; 10.3 wt. %)
Thermally conductive filler: Aluminum (650 parts; 66.7 wt. %), Zinc oxide (200 parts; 20.5 wt. %),
Additives: Isoparaffin (25 parts; 2.6 wt.

In each of the above examples and the comparative example, the additive iso-paraffin was used to reduce viscosity and help mixing. It flashed off gradually upon exposure to air.

The component materials can be obtained commercially.

The examples and comparative example were characterized by measuring their thermal conductivity as follows. A sample of each was prepared and tested using C-Therm's TCi thermal conductivity Analyzer per the method specified by ASTM D7984. All samples were well-mixed and spread into a thin layer approximately 1 mm thick on a piece of aluminum foil to flash off the isoparaffin. The layers was baked in an oven for 200 hrs at 65° C. before thermal conductivity testing in order to flash off the isoparaffin, only keeping the functional composition of the TIM.

The table below lists the test results.

| Example | Thermal conductivity (W/(m K)) |
| --- | --- |
| 1 | 6.01 |
| 2 | 6.13 |
| 3 | — |
| Comparative example 1 | 5.70 |

Compared with comparative example, examples 1 and 2 showed thermal conductivity improvements with added diamond particles. It is believed that this result demonstrates the viability of adding diamond powder to improve the thermal performance of TIM.

No thermal conductivity measurement of example 3 was made because this sample dried out after baking and the thermal paste became soft clay-like mass, believed unsuitable for use as a TIM. It is believed that with higher levels of solid particle loading, the surface area of the particles increased significantly, which absorbed most of the poly-matrix and destroyed the TIM's continuity and ductility.

Accordingly, it is believed there is a balance between filler material combination, size distribution, total solid particle loading and its polymer matrix carrier.

Figure 5B:
FIGS. 5A through 5D are scanning electron microscope photographs of an example thermal interface material In the drawings, like references indicate like elements.
Figure 5A:
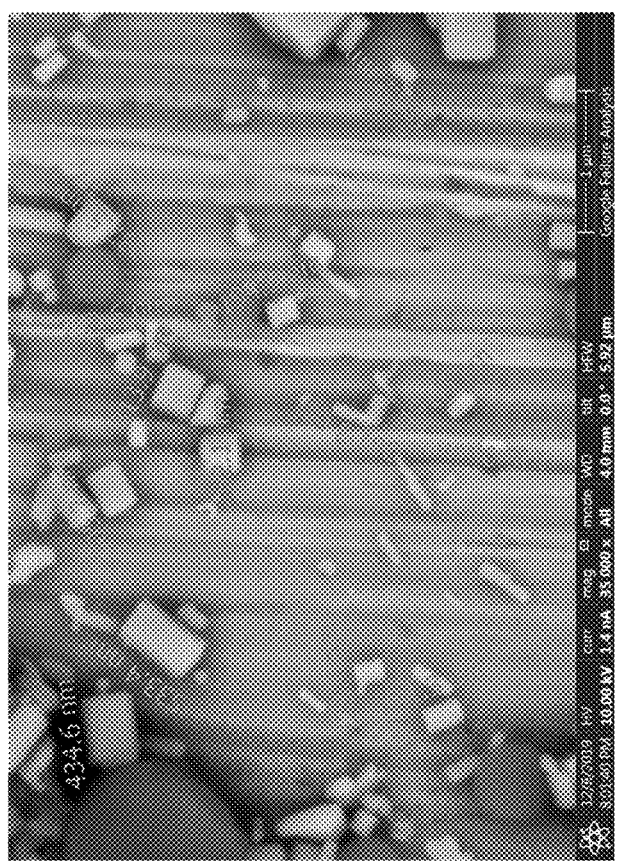

FIGS. 5A to 5D show SEM images of an example TIM composed of polymethylsiloxane, aluminum, zinc oxide, and diamond. FIG. 5A show the particles of aluminum and zinc oxide. The image is at a magnification of 6,500×. FIG. 5B shows the particles at a magnification of 35,000×. The darker colored, spherical shaped particles are aluminum and the lighter colored, random shaped particles are zinc oxide. These two SEM images not only show the particle shape, but also their sizes. The diamond particles are much smaller than the aluminum and zinc oxide particles and cannot be seen in these images.

Figure 5D:
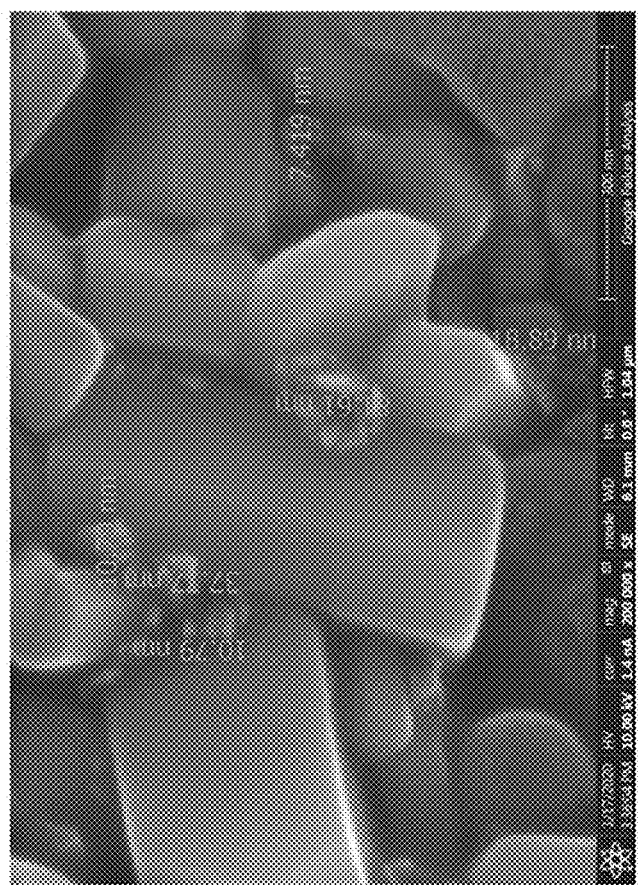
Figure 5C:
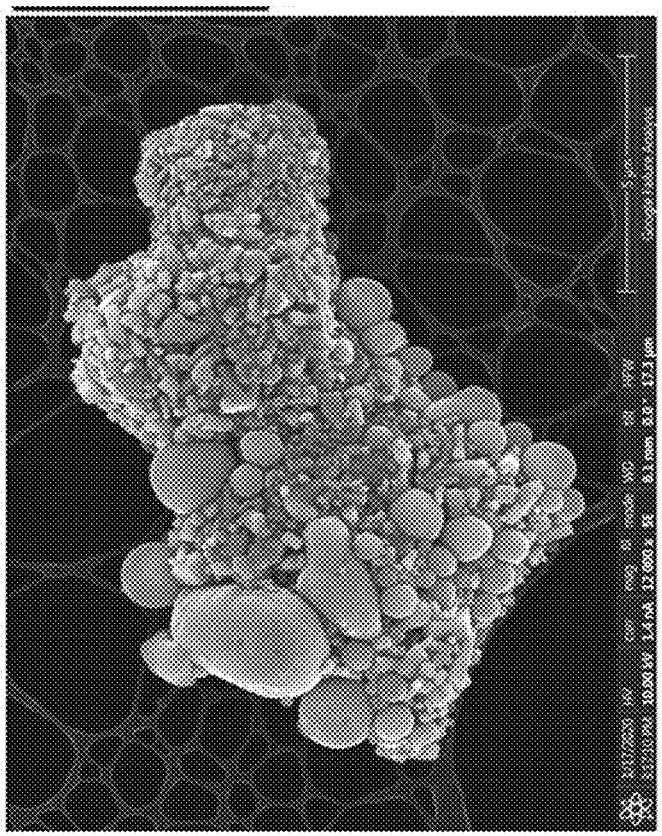

FIG. 5C shows a cluster of filler material and a web shaped matrix in the background, which is the polydimethylsiloxane matrix. This image is shown at a magnification of 17,000×. The cluster is the solid filler, composed of aluminum, zinc oxide and diamond.

FIG. 5D shows a region of the cluster shown in FIG. 5C in an image at a magnification of 200,000×. The diamond particles are visible between other particles and the sizes of the diamond particles are labeled.

While the highest thermal conductivity of the examples described above is 6.13 W/(m K), it is believed that higher thermal conductivity can be achieved by increasing the amount of diamond powder in the TIM. In order to do so, the type and amount of the other filler materials can be varied (e.g., decreased from the amounts disclosed in the examples above) to so that the TIM maintains a suitable consistency for use. Empirical optimization of the TIM composition can be performed in accordance with the principles described herein.

A number of embodiments have been described. Other embodiments are in the following claims.

What is claimed is:

1. A method of making a thermal interface material, comprising:
    combining a powder of diamond particles having a nominal dimension in a range from 10 nm to 500 nm with a volatile liquid hydrocarbon material to provide a diamond dispersion; and
    combining the diamond dispersion with a first mixture to provide the thermal interface material,
    wherein the first mixture comprises a matrix material and particles of a first material having a nominal dimension in a range from 1 micron to 100 microns,
    wherein the first material is selected from the group consisting of aluminum, gold, silver, and copper, and
    wherein the diamond particles compose 0.1 wt. % to 5 wt. % of the thermal interface material, the matrix material composes 10 wt. % or less of the thermal interface material, and the particles of the first material compose at least 40 wt. % of the thermal interface material.

2. The method of claim 1, wherein, prior to combining the powder of diamond particles with the hydrocarbon material, the powder is filtered to reduce an amount of diamond particles larger than the nominal dimension in the powder.

3. The method of claim 2, wherein the powder is filtered by sieving.

4. The method of claim 1, wherein, prior to combining the powder of diamond particles with the hydrocarbon material, the powder is washed using an organic solvent.

5. The method of claim 4, wherein after the powder is washed and prior to combining the powder of diamond particles with the hydrocarbon material, the powder is dried and re-powdered.

6. The method of claim 5, wherein re-powdering the powder of diamond particles comprises agitating and/or sonicating the powder.

7. The method of claim 1, wherein combining the powder of diamond particles with the hydrocarbon material comprises agitating and/or sonicating the powder together with the hydrocarbon material.

8. The method of claim 1, wherein the hydrocarbon material is an isoparaffin.

9. The method of claim 1, wherein combining the diamond dispersion with the first mixture comprises agitating and/or sonicating the diamond dispersion together with the first mixture.

10. The method of claim 1, further comprising de-aerating the thermal interface material.

11. The method of claim 10, wherein de-aerating the thermal interface material comprises milling the thermal interface material.

12. The method of claim 10, wherein de-aerating the thermal interface material comprises exposing the thermal interface material to a vacuum degassing mixer.

13. The method of claim 1, wherein the first mixture is deaerated prior to combining with the diamond dispersion.

14. The method of claim 1, wherein the thermal interface material consists essentially of the matrix material, the hydrocarbon material, and a filler, the filler comprising the diamond powder and the particles of the first material, wherein the filler composes 80 wt. % or more of the thermal interface material, and the hydrocarbon material composes 10 wt. % or less of the thermal interface material.

15. The method of claim 1, wherein the first mixture further comprises particles of a second material different from the first material, the particles of the second material having a nominal dimension in a range from 0.1 microns to 20 microns and composing 5 wt. % to 25 wt. % of the thermal interface material.

16. The method of claim 15, wherein the second material is a metal oxide, a metal nitride, or a metal carbide.

17. The method of claim 16, wherein the second material is selected from the group consisting of aluminum nitride, silicon carbide, aluminum oxide, zinc oxide, and cubic boron nitride.

18. The method of claim 15, wherein the nominal dimension of the particles of the second material is greater than the nominal dimension of the diamond particles and less than the nominal dimension of the particles of the first material.

19. The method of claim 1, wherein the material matrix is a silicone or a siloxane.

* * * * *